(12) United States Patent
Sauciuc et al.

(10) Patent No.: US 7,348,665 B2
(45) Date of Patent: Mar. 25, 2008

(54) LIQUID METAL THERMAL INTERFACE FOR AN INTEGRATED CIRCUIT DEVICE

(75) Inventors: Ioan Sauciuc, Phoenix, AZ (US); Gregory M. Chrysler, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 325 days.

(21) Appl. No.: 10/917,702

(22) Filed: Aug. 13, 2004

(65) Prior Publication Data

US 2006/0033205 A1 Feb. 16, 2006

(51) Int. Cl.
*H01L 23/46* (2006.01)
*H01L 23/473* (2006.01)

(52) U.S. Cl. ............... 257/714; 257/706; 257/712; 257/E23.097; 257/E23.098

(58) Field of Classification Search ............ 257/706, 257/712, 714, E23.097, E23.098
See application file for complete search history.

(56) References Cited

U.S. PATENT DOCUMENTS

| | | | | |
|---|---|---|---|---|
| 3,654,528 | A * | 4/1972 | Barkan | 257/714 |
| 4,037,246 | A | 7/1977 | Pellant et al. | |
| 5,658,831 | A * | 8/1997 | Layton et al. | 29/832 |
| 6,658,861 | B1 | 12/2003 | Ghoshal et al. | |
| 6,708,501 | B1 | 3/2004 | Ghoshal et al. | |
| 6,791,839 | B2 * | 9/2004 | Bhagwagar | 361/705 |
| 6,795,315 | B1 * | 9/2004 | Wu et al. | 361/695 |
| 6,815,835 | B2 * | 11/2004 | James | 257/783 |
| 7,030,485 | B2 * | 4/2006 | Houle et al. | 257/712 |

FOREIGN PATENT DOCUMENTS

GB 914034 12/1962
JP 60084848 5/1985

OTHER PUBLICATIONS

U.P. Hwang et al., "Electronic Equipment Cooling Using MHD Flow of Coolant", *IBM Technical Disclosure Bulletin*, vol. 12, No. 3, Aug. 1969, p. 386-387, IBM Corporation, New York, USA.
PCT International Search Report and Written Opinion, mailed Dec. 9, 2005, PCT Application No. PCT/US2005/025815.

* cited by examiner

*Primary Examiner*—Evan Pert
*Assistant Examiner*—Victor A. Mandala, Jr.
(74) *Attorney, Agent, or Firm*—Kenneth A. Nelson (57) ABSTRACT

A liquid metal thermal interface for an integrated circuit die. The liquid metal thermal interface may be disposed between the die and another heat transfer element, such as a heat spreader or heat sink. The liquid metal thermal interface includes a liquid metal in fluid communication with a surface of the die, and liquid metal moving over the die surface transfers heat from the die to the heat transfer element. A surface of the heat transfer element may also be in fluid communication with the liquid metal. Other embodiments are described and claimed.

22 Claims, 8 Drawing Sheets

LIQUID METAL THERMAL INTERFACE FOR AN INTEGRATED CIRCUIT DEVICE

FIELD OF THE INVENTION

The invention relates generally to the packaging of integrated circuit die and, more particularly, to a liquid metal thermal interface for an integrated circuit device.

BACKGROUND OF THE INVENTION

Figure 1:
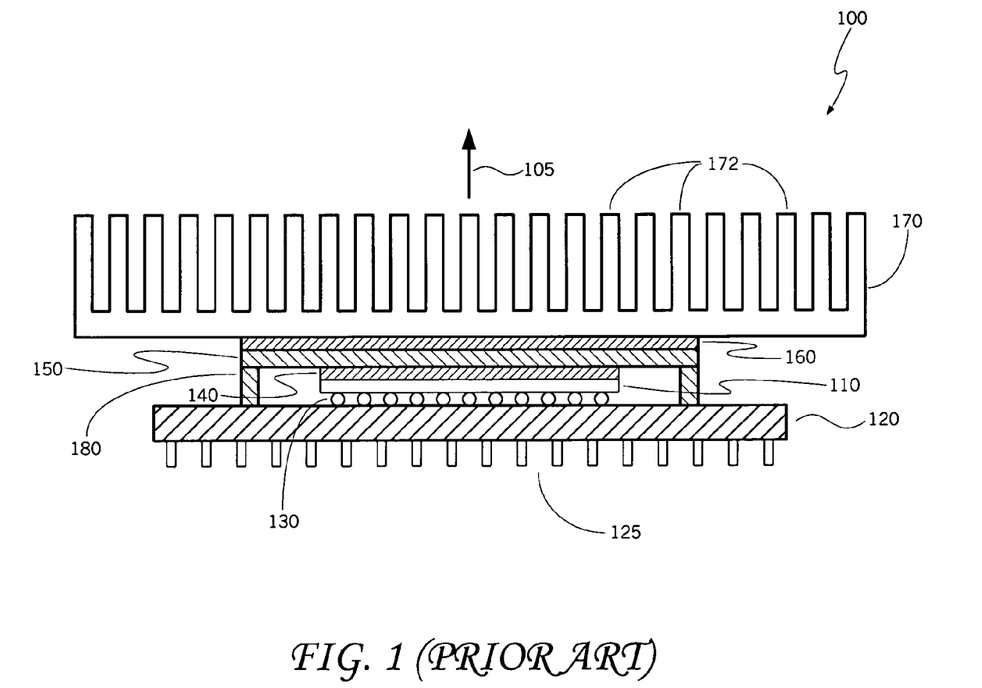
FIG. 1 is a schematic diagram illustrating a cross-sectional elevation view of a conventional integrated circuit device.

Illustrated in FIG. 1 is a conventional packaged integrated circuit (IC) device 100. The IC device 100 includes a die 110 that is disposed on a substrate 120, this substrate often referred to as the "package substrate." The die 110 may comprise a microprocessor, a network processor, or other processing device. Die 110 may be coupled with the substrate using, for example, a Controlled Collapse Chip Connection (or "C4") assembly technique, wherein a plurality of leads, or bond pads, on the die 110 are electrically connected to a corresponding plurality of leads, or lands, on the substrate 120 by an array of connection elements 130 (e.g., solder bumps, columns, etc.). Circuitry on the package substrate 120, in turn, routes the die leads to locations on the substrate 120 where electrical connections can be established with a next-level component (e.g., a motherboard, a computer system, a circuit board, another IC device, etc.). For example, the substrate circuitry may route all signal lines to a pin-grid array 125—or, alternatively, a ball-grid array—formed on a lower surface of the package substrate 120. The pin-grid (or ball-grid) array then electrically couples the die to the next-level component, which includes a mating array of terminals (e.g., pin sockets, bond pads, etc.).

During operation of the IC device 100, heat generated by the die 110 can damage the die if this heat is not transferred away from the die or otherwise dissipated. To remove heat from the die 110, the die 110 may ultimately be coupled with a heat sink 170 via a number of thermally conductive components, including a first thermal interface 140, a heat spreader 150, and a second thermal interface 160. Generally, a thermal interface is a component that fills in small pits and other surface irregularities on two mating solid surfaces and, further, that provides a thermally conductive path between these mating surfaces, such that the two solid surfaces are thermally linked. A typical thermal interface comprises a layer of a conductive material, such as a solder or a thermal grease.

The first thermal interface 140 is coupled with an upper surface of the die 110, and this thermal interface conducts heat from the die and to the heat spreader 150. Heat spreader 150 conducts heat laterally within itself to "spread" the heat laterally outwards from the die 110, and the heat spreader 150 also conducts the heat to the second thermal interface 160. The second thermal interface 160 conducts the heat to heat sink 170, which transfers the heat to the ambient environment. Heat sink 170 may include a plurality of fins 172, or other similar features providing increased surface area, to facilitate convection of heat to the surrounding air. The IC device 100 may also include a seal element 180 to seal the die 110 from the operating environment, wherein the seal element 180 and heat spreader 150 may comprise an integrated cap or housing for the die 110.

The heat sink 170, heat spreader 150, and first and second thermal interface devices 140, 160 collectively form a cooling system for the die 110. The power dissipation of microprocessors and other processing devices generally increases with each design generation, as the operating frequencies of these devices are ratcheted upwards. Also, the design and operating conditions for a die may lead to "hot spots" on the die where the local temperature is significantly greater than in surrounding regions on the die, and a failure to adequately extract heat from such hot spots may lead to damage and/or a degradation in performance of the die. Thus, the thermal performance of die cooling systems in future generations of IC devices will become increasingly critical, and the thermal performance required for these devices may push the limits of the conventional cooling system illustrated in FIG. 1.

DETAILED DESCRIPTION OF THE INVENTION

One possible solution to meet the heat dissipation needs of microprocessors and other processing devices is to employ an active cooling system—e.g., a liquid based cooling system that relies, at least in part, on convective heat transfer initiated by the movement of a working fluid—rather than (or in combination with) heat sinks and other passive heat removal components. Disclosed herein are embodiments of a cooling system for an integrated circuit (IC) device—as well as embodiments of a method of cooling an IC device—wherein the cooling system includes a liquid metal thermal interface that is disposed between a die and a heat transfer element, such as a heat spreader or a heat sink. Embodiments of a method of making a liquid metal thermal interface are also disclosed.

Figure 2:
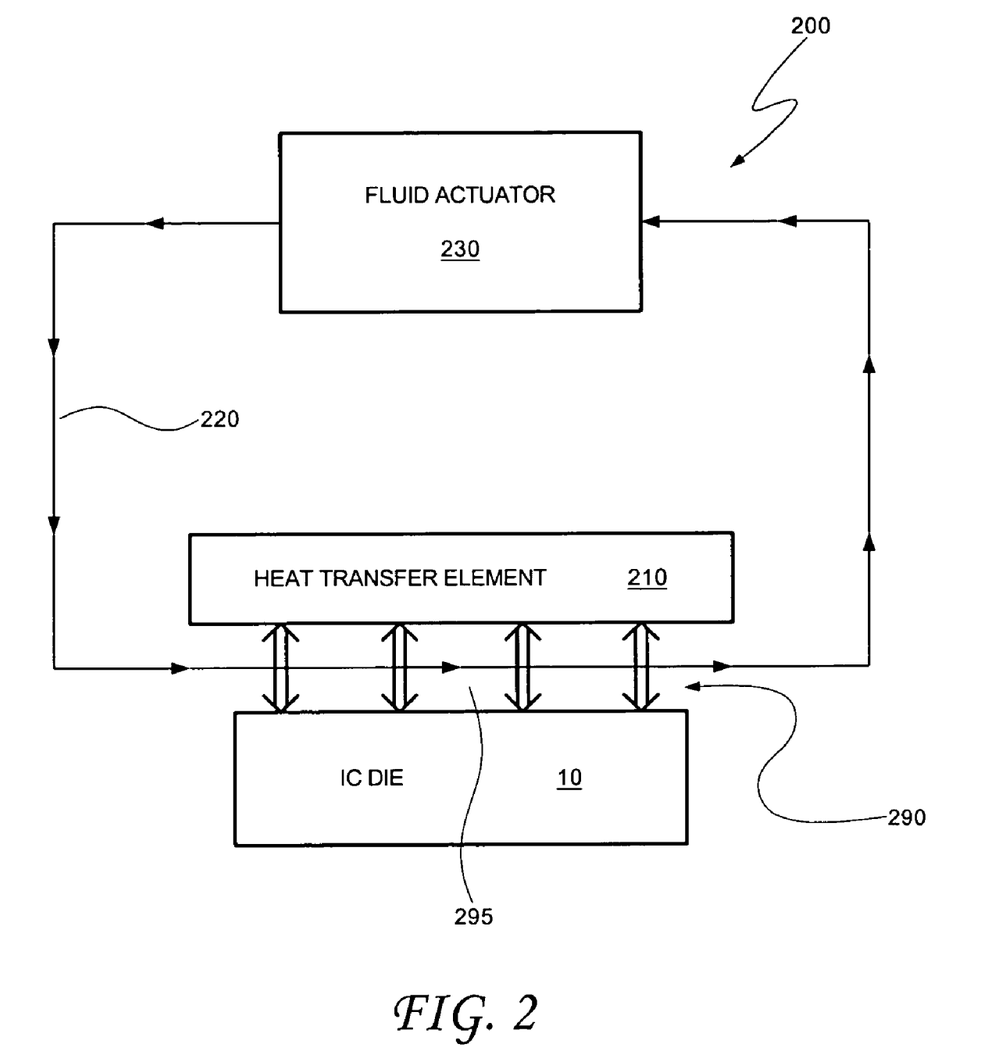
FIG. 2 is a schematic diagram illustrating an embodiment of an integrated circuit device having a liquid metal thermal interface.

Referring now to FIG. 2, illustrated is an embodiment of a cooling system 200 including a liquid metal thermal interface. The cooling system 200 is coupled with an IC die 10. During operation of the IC die 10, the die may generate heat, and the cooling system 200 is capable of dissipating at least some of this heat, such as may be accomplished by transferring heat away from the IC die 10 and to the ambient environment. The IC die 10 may comprise any type of integrated circuit device, such as a microprocessor, network processor, application specific integrated circuit (ASIC), or other processing device.

The cooling system 200 includes a heat transfer element 210. The heat transfer element 210 may comprise any device that—either alone or in combination with other devices—is capable of transferring heat away from the die 10 or otherwise dissipating heat generated by the die. In one embodiment, the heat transfer element 210 comprises a heat spreader (which may, in turn, be thermally coupled with a heat sink or other heat dissipation device). In another embodiment, the heat transfer element 210 comprises a heat sink, such as a multi-fin heat sink capable of transferring heat to the surrounding environment.

The heat transfer element 210 is thermally coupled with the IC die 10, such that heat transfer may occur between the die and heat transfer element by any suitable mode, or combination of modes, of heat transfer (e.g., conduction, convection, or a combination thereof). To thermally couple the heat transfer element 210 and IC die 10, the cooling system 200 includes a liquid metal thermal interface 290. According to one embodiment, the liquid metal thermal interface 290 comprises a flowing liquid metal moving through and/or within the region 295 between the IC die 10 and heat transfer element 210. The liquid metal may be circulated within the thermal interface region 295 by a fluid circuit, which will be described below in more detail. In one embodiment, the thermal interface 290 transfers heat between the IC die 10 and heat transfer element 210 by a combination of conduction (e.g., from a solid surface to the moving liquid metal) and convection (e.g., forced convection brought about by movement of liquid metal).

Generally, the liquid metal of thermal interface 290 may comprise any metal or metal alloy that can remain in the liquid state throughout the operational range of the IC die 10 (note that the low end of the operational range may be significantly less than room temperature). In one embodiment, the liquid metal comprises a thermally conductive material and, in a further embodiment, the liquid metal also comprises an electrically conductive material. By way of example, the liquid metal may comprise an alloy of one or more of the following metals: gallium, indium, mercury, tin, lead, copper, zinc, and bismuth (e.g., a gallium-indium alloy). It should, however, be understood that the disclosed embodiments are not limited to the use of liquid metals and, further, that a thermal interface utilizing a non-metal working fluid is within the scope of the disclosed embodiments.

In one embodiment, the liquid metal is in fluid communication with a surface of the IC die 10. In another embodiment, a protective coating and/or insulating layer has been placed on the die surface, and it should be understood that the liquid metal may be in fluid communication with this coating or layer on the die surface (and, as used herein, the phrase "fluid communication" should not be limited to the case where a fluid is in direct fluid communication with a surface of the die). In a further embodiment, the liquid metal is in fluid communication with a surface of the heat transfer element 210 (or with a coating or other material layer disposed over this surface). In yet another embodiment, the liquid metal is in fluid communication with both a surface of the die and a surface of the heat transfer element.

To move liquid metal (or other working fluid) within the thermal interface region 295, the cooling system 200 includes a fluid circuit 220. Generally, the fluid circuit 220 comprises any component or collection of components—e.g., fluid pumps, valves, conduits, seals, etc.—that is capable of moving liquid metal through the thermal interface region 295. In one embodiment, the fluid circuit 220 comprises a substantially sealed, closed-loop fluid circuit. However, as the reader will appreciate, such a sealed closed-loop fluid system may exhibit a small amount of leakage. In an alternative embodiment, the fluid circuit 220 is not a closed-loop fluid system (e.g., replacement of a portion of the working fluid may periodically be needed).

In one embodiment, the fluid circuit 220 includes a fluid actuator 230. The fluid actuator 230 comprises any device, such as a pump, that is capable of moving a fluid through the fluid circuit 220 and, hence, within the thermal interface region 295. According to one embodiment, where the working fluid comprises an electrically conductive liquid metal, the fluid actuator 230 comprises an electromagnetic pump. However, it should be understood that other types of pumps (e.g., gear pumps, diaphragm pumps, etc.) may find use with the disclosed embodiments.

Figure 3:
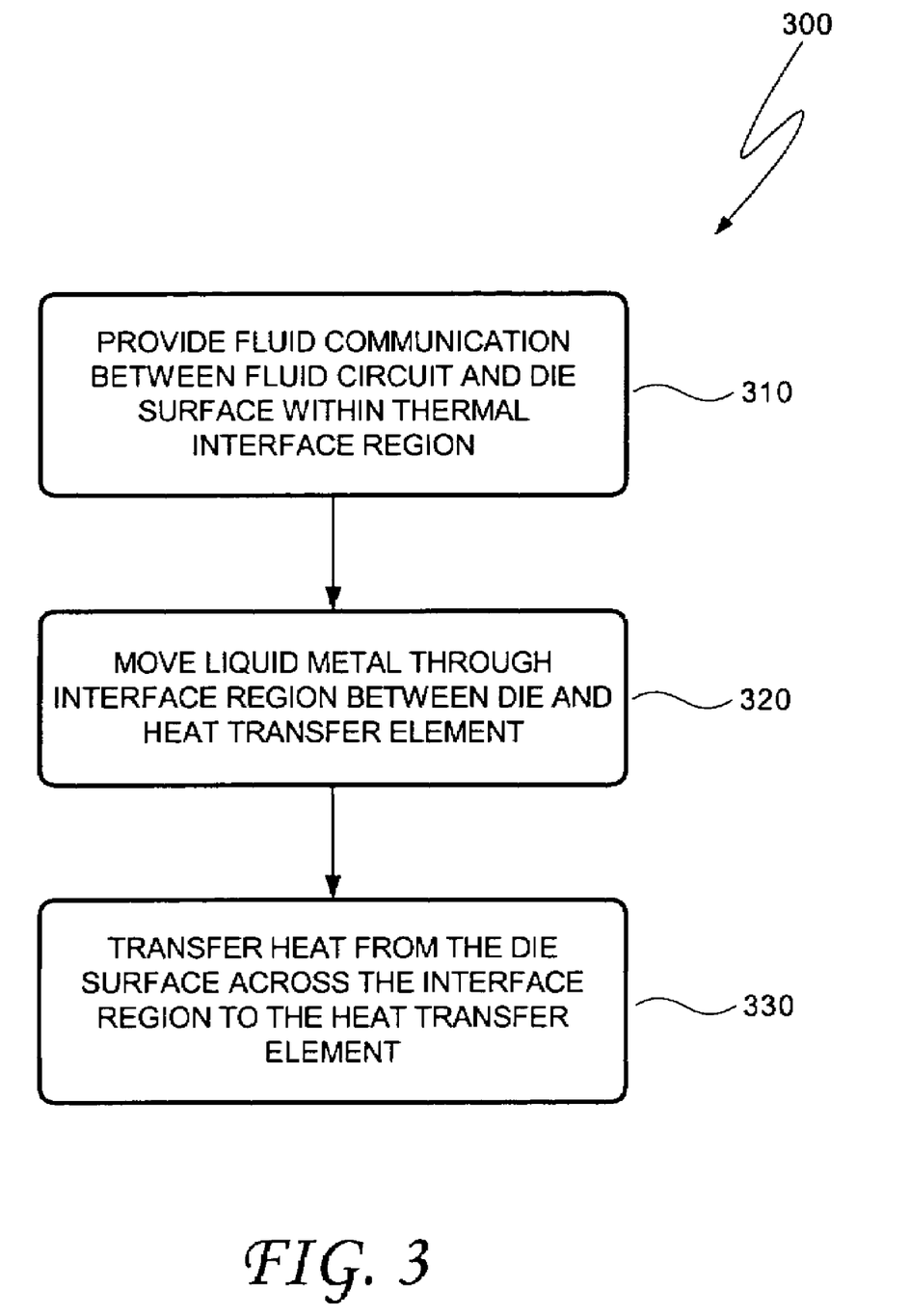
FIG. 3 is a block diagram illustrating an embodiment of a method of cooling an integrated circuit die with a liquid metal thermal interface.

Referring now to FIG. 3, illustrated is an embodiment of a method of cooling an IC die using a liquid metal thermal interface, as may be performed by the cooling system 200 shown in FIG. 2. As set forth in block 310, within a thermal interface region, fluid communication between a fluid circuit and a surface of an IC die is provided. The thermal interface region extends between the die surface and a heat transfer element, such as a heat spreader or a heat sink. Referring to block 320, a liquid metal (or other working fluid) within the fluid circuit is moved through the thermal interface region between the die surface and heat transfer element. A pump or other fluid actuator may be used to circulate the liquid metal through the fluid circuit and thermal interface region. In one embodiment, the fluid circuit is also in fluid communication with a surface of the heat transfer element. As set forth in block 330, heat is transferred from the IC die and across the thermal interface region to the heat transfer element. In one embodiment, heat transfer across the thermal interface region takes place by a combination of convection and conduction. For example, heat transfer from the die surface to the liquid metal (flowing through the thermal interface region) may occur by conduction, and once this heat energy is in the moving fluid, it can be transferred away (and to the heat transfer element) by convection.

Figure 4A:
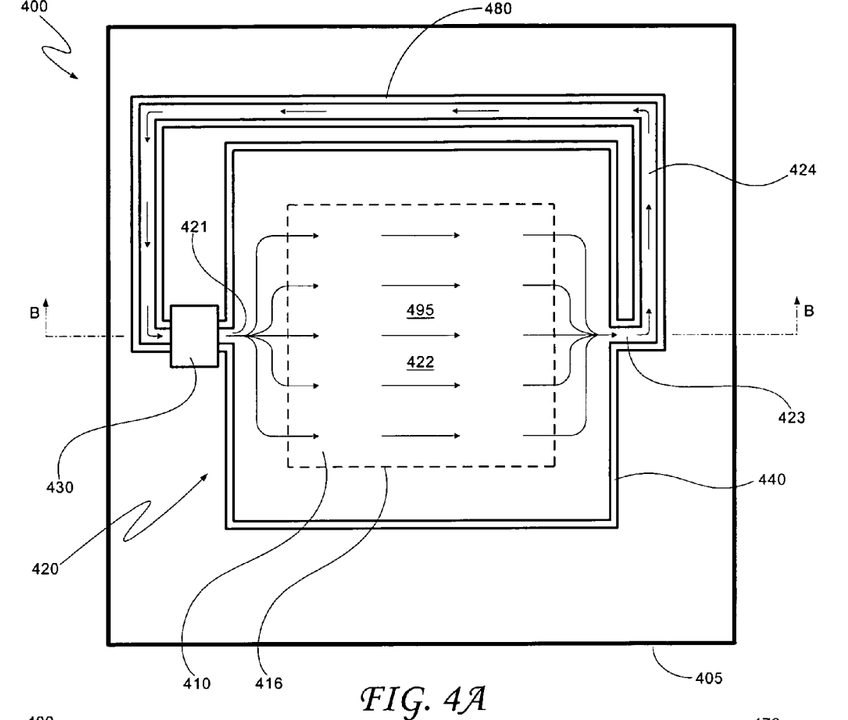
FIG. 4A is a schematic diagram illustrating a plan view of another embodiment of an integrated circuit device including a liquid metal thermal interface.
Figure 4B:
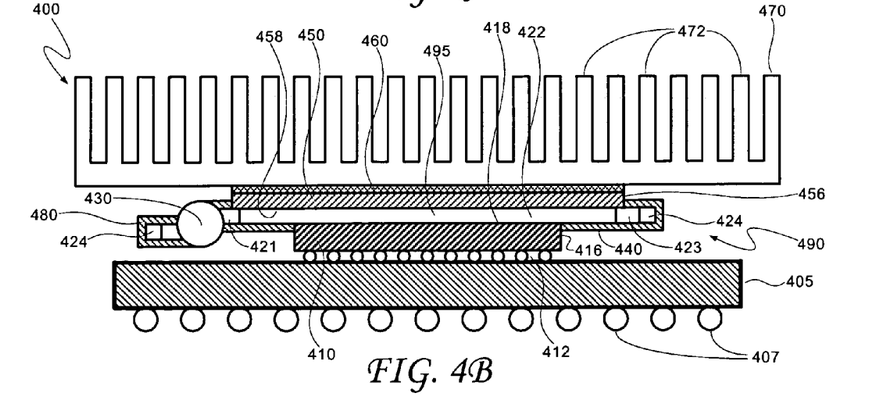
FIG. 4B is a schematic diagram showing a cross-section of the integrated circuit device of FIG. 4A, as taken along line B-B of FIG. 4A.

Turning to FIGS. 4A and 4B, illustrated is an embodiment of an IC device 400 having a liquid metal thermal interface. A plan view of the IC device 400 is shown in FIG. 4A, whereas FIG. 4B shows a side cross-sectional view of the IC device, as taken along line B-B of FIG. 4A. It should be noted that, for ease of illustration, certain parts have been omitted from the view of FIG. 4A, including a heat sink (item 470), a second thermal interface (item 460), and a heat spreader (item 450).

With reference to FIGS. 4A and 4B, the IC device 400 includes a die 410 that is disposed on a package substrate 405. The die 410 may comprise a microprocessor, a network processor, an ASIC, or other processing device. Die 410 may be coupled with the substrate using, for example, a C4 assembly technique, wherein a number of leads, or bond pads, on the die are electrically connected to a corresponding number of leads, or lands, on the substrate 405 by an array of connection elements 412 (e.g., solder bumps, columns, etc.). Circuitry on the package substrate 405, in turn, routes the die leads to locations on the substrate where electrical connections can be established with a next-level component (e.g., a motherboard, a computer system, a circuit board, another IC device, etc.). For example, the substrate circuitry may route all signal lines to a ball-grid array 407—or, alternatively, a pin-grid array—formed on a lower surface of the package substrate 405. The ball-grid (or pin-grid) array then electrically couples the die to the next-level component, which includes a mating array of terminals (e.g., pin sockets, bond pads, etc.).

Coupled with the die 410 is a liquid metal thermal interface 490 which, in turn, is coupled with a heat spreader 450. Heat spreader 450 is coupled with a second thermal interface 460, and a heat sink 470 (or other passive or active heat dissipation device) is coupled with the second thermal interface 460. The liquid metal thermal interface 490, which is described in greater detail below, transfers heat from the die 410 to the heat spreader 450. Heat spreader 450 may conduct heat laterally within itself to "spread" the heat laterally outwards from the die 410, and the heat spreader 450 may also conduct heat to the second thermal interface 460. The second thermal interface 460 conducts heat to heat sink 170, which may transfer heat to the ambient environment.

According to one embodiment, heat sink 470 includes a plurality of fins 472, or other similar features providing increased surface area, to facilitate convection of heat to the surrounding air. It should, however, be understood that the disclosed embodiments are not limited to the use of a multi-finned heat exchanger nor to the ultimate dissipation of heat to the surrounding air. For example, in another embodiment, an active cooling device (e.g., a liquid-cooled plate or a refrigeration system) may be coupled to the heat spreader 450 by the second thermal interface 460. Heat carried by the liquid metal would then be exhausted to the active cooling system (which may include a working fluid), and the active cooling system can than transport the heat away.

The liquid metal thermal interface 490 transfers heat from the die 410 across a thermal interface region 495 to the heat spreader 450. In one embodiment, transfer of heat across the thermal interface region takes place through a combination of conduction (e.g., from the die surface 418 to the liquid metal) and convection (e.g., forced convection performed by the moving liquid metal). The capacity of the liquid metal thermal interface 490 to transfer heat away from the die 410 and to the heat spreader 450 (or other heat transfer element) may be dependent upon the thermal conductivity of the liquid metal and the velocity of the liquid metal as it flows through the thermal interface region 495. For example, if the liquid metal is a "good" thermal conductor, the velocity of the liquid metal flowing through the thermal interface region may be low to maintain the die surface 418 within a given temperature range. Conversely, if the liquid metal is a relatively "poor" thermal conductor, the velocity of the liquid metal may need to be relatively higher in order to maintain the die surface within the given temperature range.

To move a liquid metal (or other working fluid) through the thermal interface region 495, as well as to contain the liquid metal, the IC device 400 may further include a fluid circuit 420. The fluid circuit 420 may, according to one embodiment, comprise a substantially sealed, closed-loop fluid circuit. In one embodiment, the fluid circuit 420 includes an inlet 421 that opens into a fluid chamber 422 having an outlet 423. Fluid circuit 420 also includes a return line 424 having one end in fluid communication with the chamber outlet 423 and an opposing end coupled with a fluid actuator 430. The fluid actuator 430 is, in turn, coupled with the inlet 421 of the chamber 422. Thus, the fluid actuator 430, inlet 421, chamber 422, outlet 423, and return line 424 may comprise a closed-loop fluid circuit.

Generally, the thermal interface region 495 is defined by or included within the fluid chamber 422. In one embodiment, the fluid chamber 422 is sized to encompass an outer perimeter 416 (and surface 418) of the die 410. According to another embodiment, the fluid chamber 422 is defined by a surface 418 of the die 410, the walls of a housing 440, and by a surface 458 of the heat spreader 450. Housing 440 may be constructed from any suitable material, including plastics and metals (e.g., copper). The housing 440 may be attached to the die 410 using any suitable joining method and/or device. By way of example, the housing 440 may be attached to the die 410 using an epoxy or a solder. In one embodiment, a fluid seal is formed between the die 410 and housing 440 about a perimeter 416 of the die. Similarly, any suitable joining method and/or device may be employed to attach the housing 440 to heat spreader 450. For example, the housing 440 may be attached to the heat spreader 450 using an epoxy or a solder. In one embodiment, a fluid seal is formed between the heat spreader 450 and housing 440 about a perimeter 456 of the heat spreader. Heat spreader 450 may be constructed from any suitable conductive material (e.g., copper, a composite material, etc.). In the embodiment of FIGS. 4A-4B, the liquid metal within fluid chamber 422 is in fluid communication with the surface 418 of die 410, as well as with the surface 458 of heat spreader 450.

Return line 424 may be provided by any suitable flow path. In one embodiment, the return line 424 comprises a conduit 480 constructed from any suitable pipe or tubing. Conduit 480 may be formed from any suitable material, including plastics or metals. In one embodiment, the conduit 480 is formed integral with the housing 440 (e.g., as a single injection molded part fabricated from a plastic material). The conduit 480 may be coupled with the housing 440 (if not integral therewith) and with the fluid actuator 430 using any suitable connection methods and/or devices, such as swaging techniques, bonding processes (e.g., epoxy bonding or soldering), or tapped fittings.

Fluid actuator 430 may comprise any device capable of circulating liquid metal within fluid circuit 420 and through fluid chamber 422. In one embodiment, where the liquid metal is electrically conductive, the fluid actuator 430 may comprise an electromagnetic pump. According to other embodiments, however, the fluid actuator may comprise another type of pump or device (e.g., a gear pump, a diaphragm pump, etc.). The fluid actuator 430 may be coupled with the conduit 480 and inlet 421 (note that a length of pipe or tubing may extend between fluid actuator 430 and chamber inlet 421) using any suitable connection methods and/or devices, such as swaging techniques, bonding processes (e.g., epoxy bonding or soldering), or tapped fittings. In one embodiment, the fluid actuator 430 is held in place by the actuator's connections with the conduit 480 and chamber inlet 421 of housing 440. In another embodiment, the fluid actuator 430 is disposed on the package substrate 405, and in a further embodiment, the fluid actuator 430 is formed or constructed within the package substrate 405.

In one embodiment, the liquid metal within fluid circuit 420 comprises any metal (or other fluid) that remains in the liquid state throughout the operational temperature range of the IC device 400. According to one embodiment, the liquid metal is thermally conductive, and in a further embodiment, the liquid metal is also electrically conductive. By way of example, the liquid metal may comprise an alloy of one or more of the following metals: gallium, indium, mercury, tin, lead, copper, zinc, and bismuth (e.g., a gallium-indium alloy). In one embodiment, the quantity of liquid metal in the fluid circuit 420 is sufficient to substantially fill the fluid chamber 422 (as well as the inlet and outlet 421, 423) and the return line 424 (e.g., there is substantially no air within the fluid circuit 420, although in other embodiments, there may be air or another gas present within the fluid circuit 420).

In operation, liquid metal (or other working fluid) is circulated within the fluid circuit 420 by fluid actuator 430. The liquid metal enters the fluid chamber 422 through inlet 421 and into the thermal interface region 495. Once in the chamber 422, the liquid metal can flow over the surface 418 of die 410, as well as over the surface 458 of heat spreader 458. Due to conduction of heat from the die surface 418 to the liquid metal and, further, to convection initiated by movement of the liquid metal over the opposing surfaces 418, 458, heat is transferred away from the die 410 and to the heat spreader 450. Note that, as the liquid metal transfers heat to the heat spreader 450, the liquid metal may be cooled. The liquid metal flowing through the interface region 495 (and chamber 422) exits this region through the outlet 423, and the liquid metal is circulated through the return line 424 back to the fluid actuator 430.

Figure 5:
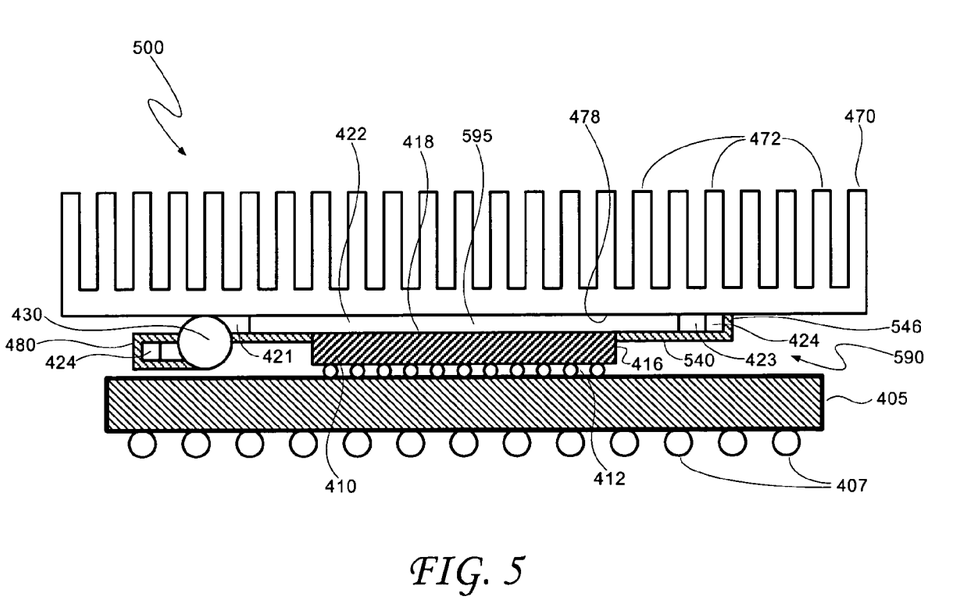
FIG. 5 is a schematic diagram illustrating a further embodiment of an integrated circuit device including a liquid metal thermal interface.

Turning next to FIG. 5, illustrated is another embodiment of an IC device 500 having a liquid metal thermal interface 590. The embodiment of FIG. 5 is similar to that shown in FIGS. 4A-4B described above, and like elements have retained the same numerical designation in FIG. 5. Also, a description of those elements previously described with respect to FIGS. 4A-4B is not repeated in the following discussion of FIG. 5.

As noted above, the IC device 500 is similar to the IC device 400 described above. However, the IC device 500 does not include a heat spreader or a second thermal interface. Rather, these components have been omitted, and the liquid metal thermal interface 590 is disposed between the die 410 and heat sink 470. The fluid circuit 420 is similar to that set forth above; however, the fluid circuit is in fluid communication with a surface 478 of the heat sink 470. Further, the fluid chamber 422 is defined by the surface 418 of die 410, the surface 478 of heat sink 470, as well as the walls of a housing 540. The housing 540 may be constructed from any suitable material (e.g., plastics, metals, etc.), and the housing is coupled with the heat sink 470 about a periphery 546 of the housing—and also with the die 410 about the die's periphery 416—using any suitable joining methods and/or devices (e.g., epoxy, solder, etc.). Cooling of the die 410 takes place in a manner similar to that described above; however, the liquid metal thermal interface 590 transfers heat from the die 410 directly to the heat sink 470. The embodiment of FIG. 5 may be both more efficient and lower in cost (as compared to the embodiment of FIGS. 4A-4B). Again, the disclosed embodiments are not limited to the use of a multi-finned heat exchanger or other passive devices, and the heat sink 470 may be replaced by an active cooling system (e.g., a liquid cooled plate, the evaporator of a refrigeration system, etc.)

Figure 6A:
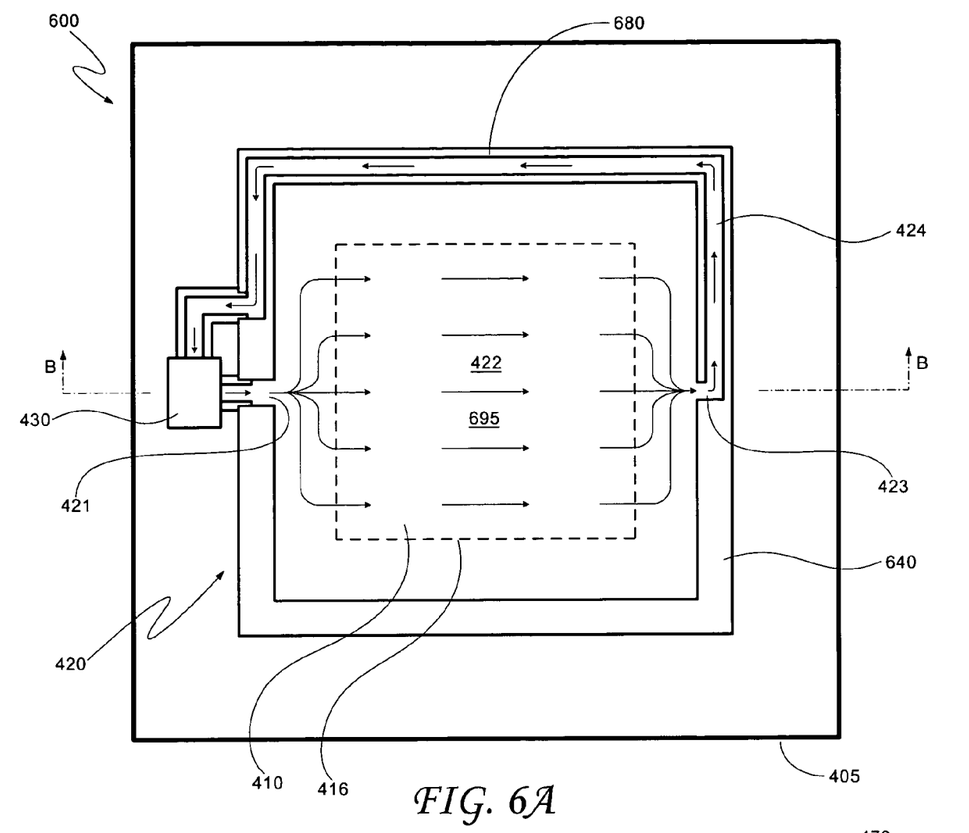
FIG. 6A is a schematic diagram illustrating a plan view of yet a further embodiment of an integrated circuit device including a liquid metal thermal interface.
Figure 6B:
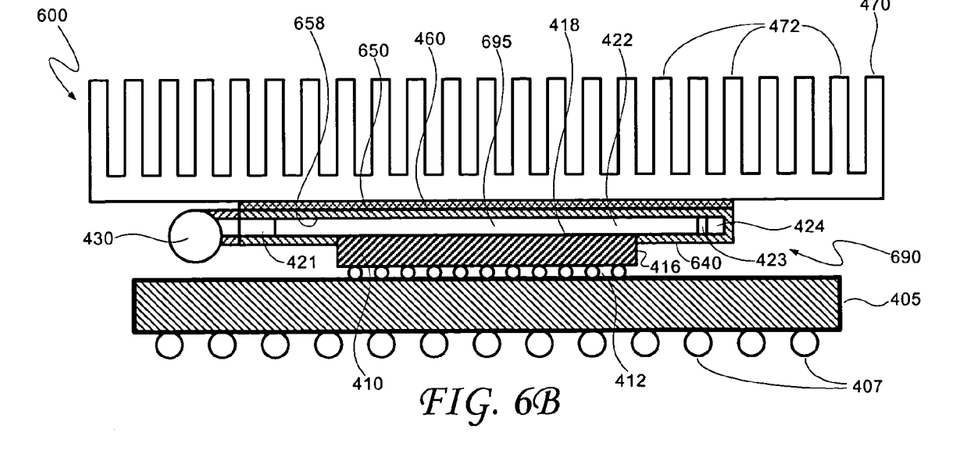
FIG. 6B is a schematic diagram showing a cross-section of the integrated circuit device of FIG. 7A, as taken along line B-B of FIG. 7A.

Illustrated in FIGS. 6A and 6B is yet another embodiment of an IC device 600 having a liquid metal thermal interface 690. A plan view of the IC device 600 is shown in FIG. 6A, whereas FIG. 6B shows a side cross-sectional view of the IC device, as taken along line B-B of FIG. 6A. It should be noted that, for ease of illustration, certain parts have been omitted from the view of FIG. 6A, including a heat sink (item 470), a second thermal interface (item 460), and an upper wall (item 650) of a housing (item 640).

The embodiment of FIGS. 6A-6B is similar to that shown in FIGS. 4A-4B described above, and like elements have retained the same numerical designation in FIGS. 6A-6B. Also, a description of those elements previously described with respect to FIGS. 4A-4B is not repeated in the following discussion of FIGS. 6A-6B.

As noted above, the IC device 600 is similar to the IC device 400 described above. However, the IC device 600 does not include a separate heat spreader. Rather, a housing 640—that, in part, defines the fluid chamber 422—includes an upper wall 650, and this upper wall 650 of housing 640 is coupled directly with the second thermal interface 460. In essence, the upper wall 650 of housing 640 functions as a heat spreader, and the fluid chamber 422 is defined by the walls of housing 640 and the upper surface 418 of die 410. The fluid circuit 420 is similar to that set forth above; however, the fluid circuit is in fluid communication with an inner surface 658 of the upper housing wall 650, and liquid metal within the fluid chamber 422 transfers heat from the die 410 to the upper housing wall 650 (which, as noted above, may function as a heat spreader).

The housing 640 may be constructed from any suitable material or combination of materials. At least the upper housing wall 650 is constructed from a thermally conductive material (e.g., copper), but other portions of the housing 640 may be constructed from non-thermally conductive materials (e.g., plastics). For example, the upper housing wall 650 could be constructed from copper (or other thermally conductive metal) and the remainder of the housing 640 constructed from an injection molded plastic (wherein an overmolding process may be used to mold the plastic material over the copper material). In other embodiments, however, the entire housing may be constructed from a thermally conductive material, such as copper or a composite material.

In yet a further embodiment, which is also illustrated in FIGS. 6A-6B, the return path 424 (or a portion of the return path) may be formed integral with the housing 640. For example, as shown in FIG. 6A, the return path 424 may be provided by a conduit 680 that is formed as part of the housing 640. The fluid actuator 430 may be coupled with the conduit 680 (and inlet 421 on housing 640) using any suitable connection methods and/or devices, such as swaging techniques, bonding processes (e.g., epoxy bonding or soldering), or tapped fittings.

Figure 7:
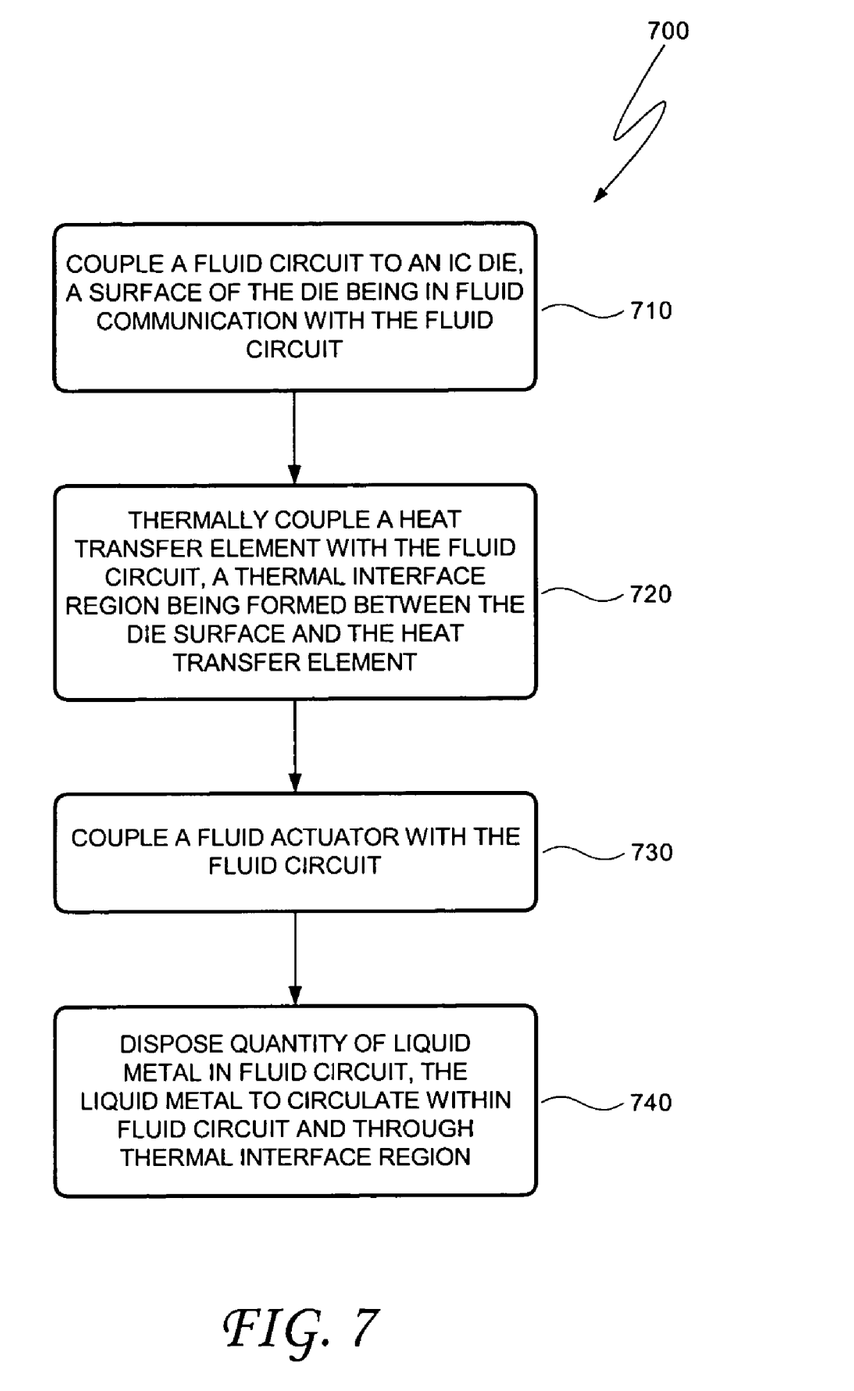
FIG. 7 is a block diagram illustrating an embodiment of a method of making a liquid metal thermal interface for an integrated circuit device.

Referring now to FIG. 7, illustrated is an embodiment of a method of making a liquid metal thermal interface for an IC device. As set forth in block 710, a fluid circuit is coupled to an IC die, with the fluid circuit being in fluid communication with a surface of the die. In one embodiment, the fluid circuit comprises a substantially sealed, closed-loop fluid circuit. Referring to block 720, a heat transfer element is thermally coupled with the fluid circuit, wherein a thermal interface region is formed between the die surface and the heat transfer element. According to one embodiment, a surface of the heat transfer element is also in fluid communication with the fluid circuit. In one embodiment, the heat transfer element comprises a heat spreader, and in another embodiment, the heat transfer element comprises a heat sink. As set forth in block 730, a fluid actuator (e.g., an electromagnetic pump or other type of pump) is coupled with the fluid circuit. With reference to block 740, a quantity of a liquid metal is disposed in the fluid circuit, the liquid metal to be circulated within the fluid circuit and through the thermal interface region (e.g., under action of the fluid actuator). In one embodiment, the liquid metal is thermally conductive, and in a further embodiment, the liquid metal is also electrically conductive.

A liquid metal thermal interface—e.g., a liquid metal thermal interface as disclosed in any one or more of FIGS. 2 through 7—can provide improved cooling. It is believed that, using a liquid metal thermal interface, die temperatures may be reduced on the order of 20° C. or more (as compared to an IC device having a conventional thermal interface between the die and heat spreader). Further, it is believed that such a liquid metal thermal interface can compensate for a non-uniform power distribution on a die (e.g., hot spots). At the same time, however, the disclosed liquid metal thermal interfaces may be implemented without any modifications to the die and, further, in a manner that is compatible with current form factors. Also, the disclosed liquid metal thermal interfaces do not require operation under a vacuum. In addition, an electrically conductive liquid metal may be moved using an electromagnetic pump, which may have no moving parts and can be very small.

Figure 8:
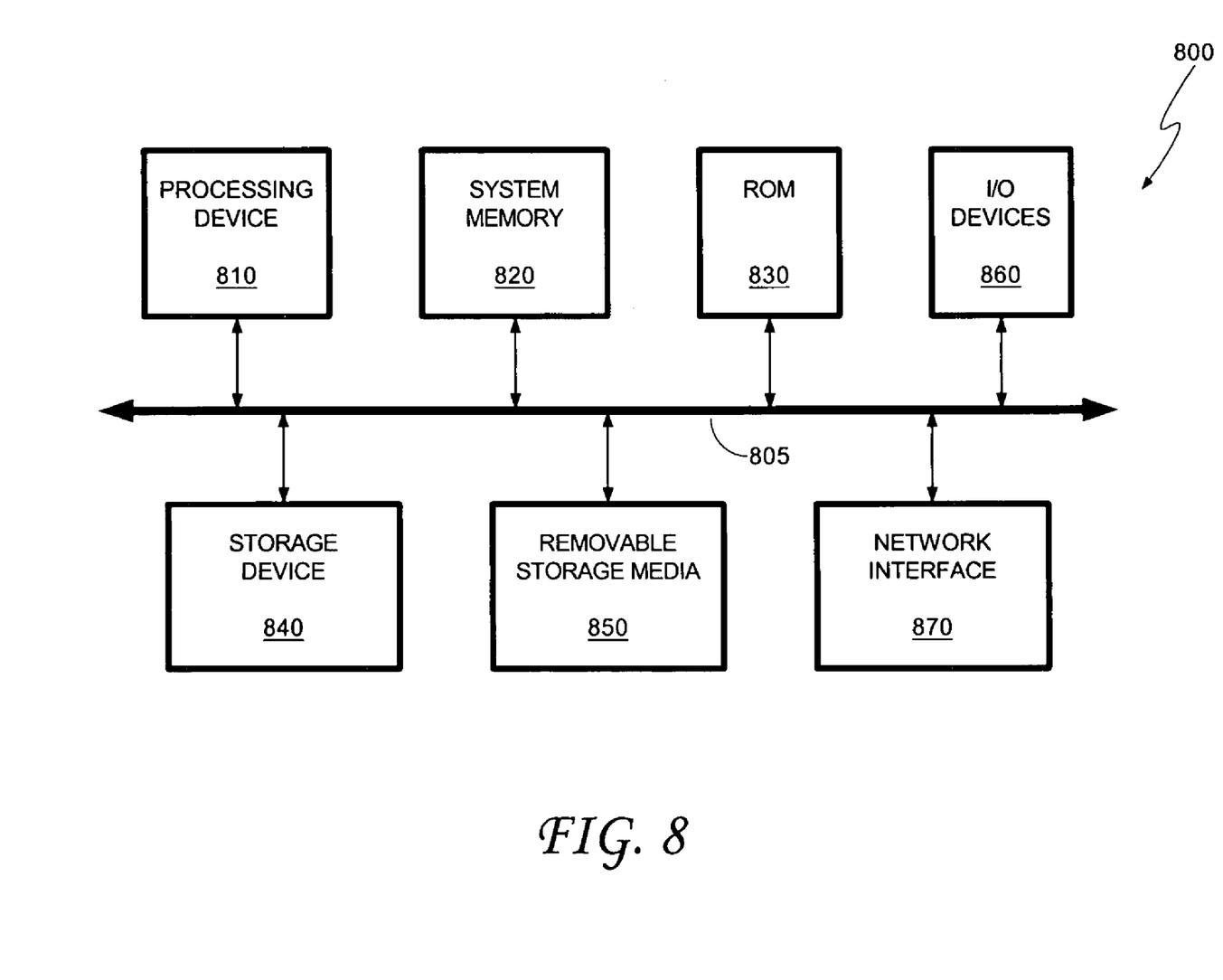
FIG. 8 is a schematic diagram illustrating an embodiment of a computer system, which may include a component having a liquid metal thermal interface according to one or more of the disclosed embodiments.

Referring to FIG. 8, illustrated is an embodiment of a computer system 800. Computer system 800 includes a bus 805 to which various components are coupled. Bus 805 is intended to represent a collection of one or more buses—e.g., a system bus, a Peripheral Component Interface (PCI) bus, a Small Computer System Interface (SCSI) bus, etc.—that interconnect the components of system 800. Representation of these buses as a single bus 805 is provided for ease of understanding, and it should be understood that the system 800 is not so limited. Those of ordinary skill in the art will appreciate that the computer system 800 may have any suitable bus architecture and may include any number and combination of buses.

Coupled with bus 805 is a processing device (or devices) 810. The processing device 810 may comprise any suitable processing device or system, including a microprocessor, a network processor, an application specific integrated circuit (ASIC), or a field programmable gate array (FPGA), or similar device. It should be understood that, although FIG. 8 shows a single processing device 810, the computer system 800 may include two or more processing devices.

Computer system 800 also includes system memory 820 coupled with bus 805, the system memory 820 comprising, for example, any suitable type and number of memories, such as static random access memory (SRAM), dynamic random access memory (DRAM), synchronous DRAM (SDRAM), or double data rate DRAM (DDRDRAM). During operation of computer system 800, an operating system and other applications may be resident in the system memory 820.

The computer system 800 may further include a read-only memory (ROM) 830 coupled with the bus 805. During operation, the ROM 830 may store temporary instructions and variables for processing device 810. The system 800 may also include a storage device (or devices) 840 coupled with the bus 805. The storage device 840 comprises any suitable non-volatile memory, such as, for example, a hard disk drive. The operating system and other programs may be stored in the storage device 840. Further, a device 850 for accessing removable storage media (e.g., a floppy disk drive or a CD ROM drive) may be coupled with bus 805.

The computer system 800 may also include one or more I/O (Input/Output) devices 860 coupled with the bus 805. Common input devices include keyboards, pointing devices such as a mouse, as well as other data entry devices, whereas common output devices include video displays, printing devices, and audio output devices. It will be appreciated that these are but a few examples of the types of I/O devices that may be coupled with the computer system 800.

The computer system 800 may further comprise a network interface 870 coupled with bus 805. The network interface 870 comprises any suitable hardware, software, or combination of hardware and software that is capable of coupling the system 800 with a network (e.g., a network interface card). The network interface 870 may establish a link with the network (or networks) over any suitable medium—e.g., wireless, copper wire, fiber optic, or a combination thereof—supporting the exchange of information via any suitable protocol—e.g., TCP/IP (Transmission Control Protocol/Internet Protocol), HTTP (Hyper-Text Transmission Protocol), as well as others.

It should be understood that the computer system 800 illustrated in FIG. 8 is intended to represent an exemplary embodiment of such a system and, further, that this system may include many additional components, which have been omitted for clarity and ease of understanding. By way of example, the system 800 may include a DMA (direct memory access) controller, a chip set associated with the processing device 810, additional memory (e.g., a cache memory), as well as additional signal lines and buses. Also, it should be understood that the computer system 800 may not include all of the components shown in FIG. 8.

In one embodiment, the computer system 800 includes a component having a liquid metal thermal interface according to any one or more of the disclosed embodiments. For example, the processing device 810 of system 800 may include a liquid metal thermal interface. However, it should be understood that other components of system 800 (e.g., network interface 870, etc.) may include a device having a liquid metal thermal interface according to the disclosed embodiments.

The foregoing detailed description and accompanying drawings are only illustrative and not restrictive. They have been provided primarily for a clear and comprehensive understanding of the disclosed embodiments and no unnecessary limitations are to be understood therefrom. Numerous additions, deletions, and modifications to the embodiments described herein, as well as alternative arrangements, may be devised by those skilled in the art without departing from the spirit of the disclosed embodiments and the scope of the appended claims.

What is claimed is:

1. A thermal interface comprising a liquid metal in fluid communication with a surface of an integrated circuit die, the liquid metal to move over the die surface and transfer heat from the die to a heat transfer element, from the heat transfer element to a thermal interface material, and from the thermal interface material to a second heat transfer element, and further comprising a fluid circuit, the fluid circuit to circulate the liquid metal through a thermal interface region between the die surface and the heat transfer element.

2. The thermal interface of claim 1, wherein the liquid metal is in fluid communication with a surface of the heat transfer element.

3. The thermal interface of claim 1, wherein the heat transfer element comprises a heat spreader.

4. The thermal interface of claim 3, wherein the second heat transfer element comprises a heat sink.

5. A device comprising:
an integrated circuit die having a surface;
a heat transfer element;
a second heat transfer element;
a thermal interface disposed between the die and the heat transfer element, the thermal interface including a liquid metal in fluid communication with the die surface, the liquid metal to move over the die surface and transfer heat from the die to the heat transfer element;

a second thermal interface disposed between the heat transfer element and the second heat transfer element, the second thermal interface transferring heat from the heat transfer element to the second heat transfer element; and a fluid circuit, the fluid circuit to circulate the liquid metal through a thermal interface region between the die surface and the heat transfer element.

6. The device of claim 5, wherein the fluid circuit includes a fluid actuator to move the liquid metal.

7. The device of claim 5, wherein the liquid metal is in fluid communication with a surface of the heat transfer element.

8. The device of claim 5, wherein the heat transfer element comprises a heat spreader.

9. The device of claim 8, wherein the second heat transfer element comprises a multi-finned heat exchanger.

10. The device of claim 5, wherein the heat transfer element comprises an active cooling system.

11. An apparatus comprising:

a fluid camber having an inlet and an outlet, wherein a wall of the fluid chamber is defined by a surface of an integrated circuit die and an opposing wall of the fluid chamber is thermally coupled with a heat transfer element, the heat transfer element is thermally coupled with a thermal interface, and the thermal interface is thermally coupled with a second heat transfer element;

a fluid actuator coupled with the inlet;

a fluid conduit extending between the outlet and the fluid actuator, wherein the fluid chamber, fluid actuator, and fluid conduit provide a fluid circuit; and a quantity of a liquid metal disposed within the fluid circuit, the fluid actuator to circulate the liquid metal through the fluid circuit;

wherein the liquid metal flowing through the chamber transfers heat from the die to the heat transfer element, from the heat transfer element to the thermal interface, and from the thermal interface to the second heat transfer element.

12. The apparatus of claim 11, wherein the fluid circuit comprises a substantially sealed closed-loop fluid circuit.

13. The apparatus of claim 11, wherein the fluid actuator comprises an electromagnetic pump.

14. The apparatus of claim 11, wherein the liquid metal comprises a substance including one or more metals selected from a group consisting of gallium, indium, mercury, tin, lead, copper, zinc, and bismuth.

15. The apparatus of claim 11, wherein a surface of the heat transfer element comprises the opposing wall of the chamber and the liquid metal flowing through the chamber is in fluid communication with the surface of the heat transfer element.

16. The apparatus of claim 11, wherein the heat transfer element comprises a heat spreader.

17. The apparatus of claim 16, wherein the second heat transfer element comprises a multi-finned heat exchanger.

18. The apparatus of claim 11, wherein the heat transfer element comprises an active cooling system.

19. A system comprising:

a memory; and a processing device coupled with the memory, the processing device including an integrated circuit die having a surface, a heat transfer element;

a second heat transfer element;

a thermal interface disposed between the die and the heat transfer element, the thermal interface including a liquid metal in fluid communication with the die surface, the liquid metal to move over the die surface and transfer heat from the die to the heat transfer element;

a second thermal interface disposed between the heat transfer element and the second heat transfer element, the second thermal interface transferring heat from the heat transfer element to the second heat transfer element; and a fluid circuit, the fluid circuit to circulate the liquid metal through a thermal interface region between the die surface and the heat transfer element.

20. The system of claim 19, wherein the liquid metal is in fluid communication with a surface of the heat transfer element.

21. The system of claim 19, wherein the heat transfer element comprises a heat spreader.

22. The system of claim 21, wherein the second heat transfer element comprises a heat sink.

* * * * *